US012666729B2

(12) United States Patent
Ye

(10) Patent No.: US 12,666,729 B2
(45) Date of Patent: Jun. 23, 2026

(54) IMAGE SENSOR, METHOD OF FORMING PIXEL, PIXEL READOUT CIRCUIT AND CALIBRATION METHOD

(71) Applicant: Samsung Electronics Co., Ltd., Suwon-si (KR)

(72) Inventor: Jing Ye, Shenzhen City (CN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 642 days.

(21) Appl. No.: 17/875,832

(22) Filed: Jul. 28, 2022

(65) Prior Publication Data

US 2023/0282673 A1    Sep. 7, 2023

(30) Foreign Application Priority Data

Mar. 4, 2022    (CN) .......................... 202210208513.6

(51) Int. Cl.
*H10F 39/18* (2025.01)
*H04N 25/62* (2023.01)
(Continued)

(52) U.S. Cl.
CPC ............. *H10F 39/18* (2025.01); *H04N 25/62* (2023.01); *H04N 25/75* (2023.01); *H10F 39/014* (2025.01)

(58) Field of Classification Search
CPC ....... H10F 39/18; H10F 39/802; H04N 25/62; H04N 25/75
See application file for complete search history.

(56) References Cited

U.S. PATENT DOCUMENTS 8,704,282 B2    4/2014   Marty et al.
9,443,899 B1    9/2016   Liu et al.
(Continued)

FOREIGN PATENT DOCUMENTS

CN        106653786 A    5/2017
CN        108281438 A    7/2018
(Continued)

OTHER PUBLICATIONS

CN Office Action for corresponding Chinese Patent Application No. 202210208513.6 issued on Sep. 6, 2024.
(Continued)

*Primary Examiner* — Brian Turner
(74) *Attorney, Agent, or Firm* — Harness, Dickey & Pierce, P.L.C.

(57)        ABSTRACT
Various example embodiments are directed to an image sensor, a method of forming a pixel, a pixel readout circuit, and a calibration method. The image sensor includes a substrate including a plurality of pixels, each pixel of the plurality of pixels configured to convert light into a corresponding electric signal, each pixel including a first photoelectric sensor and a second photoelectric sensor, a plurality of deep trench isolation (DTI) structures, each DTI structure of the plurality of DTI structures configured to isolate the first photoelectric sensor and the second photoelectric sensor of a corresponding pixel of the plurality of pixels, each DTI structure in the corresponding pixel in the substrate, a plurality of metal gates (MGs) on the plurality of DTI structures, and in each pixel of the plurality of pixels, the second photoelectric sensor is included inside the first photoelectric sensor.

20 Claims, 7 Drawing Sheets

(51) Int. Cl.
    *H04N 25/75*        (2023.01)
    *H10F 39/00*        (2025.01)

(56)               References Cited

U.S. PATENT DOCUMENTS

| | | | |
|---|---|---|---|
| 9,825,073 | B2 | 11/2017 | Webster |
| 10,373,997 | B2 | 8/2019 | Choi et al. |
| 10,461,109 | B2 | 10/2019 | Wu et al. |
| 10,833,117 | B2 | 11/2020 | Shim |
| 2018/0269245 | A1* | 9/2018 | Mlinar ................ H10F 39/8053 |
| 2019/0019820 | A1 | 1/2019 | Takizawa et al. |
| 2019/0067346 | A1* | 2/2019 | Borthakur .............. H04N 23/58 |
| 2019/0131333 | A1* | 5/2019 | Borthakur ........... H10F 39/8027 |
| 2019/0378864 | A1* | 12/2019 | Innocent ............. H04N 25/532 |
| 2020/0058684 | A1 | 2/2020 | Wu et al. |
| 2021/0202554 | A1 | 7/2021 | Liu et al. |
| 2021/0358993 | A1* | 11/2021 | Mao ..................... H04N 25/133 |
| 2022/0359602 | A1* | 11/2022 | Yamashita ........... H04N 25/778 |

FOREIGN PATENT DOCUMENTS

| | | |
|---|---|---|
| CN | 113130522 A | 7/2021 |
| JP | 2016-052041 A | 4/2016 |
| WO | 2017/130728 A1 | 8/2017 |
| WO | 2020/262383 A1 | 12/2020 |

OTHER PUBLICATIONS

Korean Office Action dated May 2, 2026 for corresponding Korean Application No. 10-2022-0126792.

* cited by examiner

A – A'

VPIX

RST

TG1

Amp

First photoelectric sensor

Select

TG2

Second photoelectric sensor

VDL

500

700

IMAGE SENSOR, METHOD OF FORMING PIXEL, PIXEL READOUT CIRCUIT AND CALIBRATION METHOD

CROSS-REFERENCE TO RELATED APPLICATION

This U.S. non-provisional application is based on and claims the benefit of priority under 35 U.S.C. § 119 to Chinese Patent Application No. 202210208513.6, filed on Mar. 4, 2022, in the Chinese National Intellectual Property Administration, the disclosure of which is incorporated by reference herein in its entirety.

BACKGROUND

Various example embodiments of the inventive concepts relate to the field of imaging, and more particularly, to an image sensor including at least one pixel, a device including the image sensor, a method of forming at least one pixel of the image sensor, a pixel readout circuit, and/or a calibration method of the at least one pixel of the image sensor.

With the development of complementary metal oxide semiconductor (CMOS) image sensor (CIS) pixels including billion pixels and with pixels of submicron sizes, the size of CIS pixels has decreased, and a distance between the CIS pixels has decreased. This decrease in distance may cause very serious crosstalk problems and/or increased crosstalk between adjacent CIS pixels.

Therefore, a technique for reducing the crosstalk between the adjacent CIS pixels is desired and/or required.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to some example embodiments, an image sensor may comprise: a substrate including a plurality of pixels, each pixel of the plurality of pixels configured to convert light into a corresponding electric signal, each pixel including a first photoelectric sensor and a second photo-electric sensor, a plurality of deep trench isolation (DTI) structures, each DTI structure of the plurality of DTI structures configured to isolate the first photoelectric sensor and the second photoelectric sensor of a corresponding pixel of the plurality of pixels, each DTI structure in the corresponding pixel in the substrate, a plurality of metal gates (MGs) on the plurality of DTI structures, and in each pixel of the plurality of pixels, the second photoelectric sensor is included inside the first photoelectric sensor.

In each of the pixel of the plurality of pixels, the second photoelectric sensor is at a center of the pixel, the second photoelectric sensor is included inside the DTI structure, and the DTI structure is included inside the first photoelectric sensor, and in each of the pixels, a center line corresponding to the first photoelectric sensor, a center line of the DTI structure, and a center line of the second photoelectric sensor overlap in at least one direction.

Each DTI structure of the plurality of DTI structures may include a first perimeter and a second perimeter, and the first perimeter and the second perimeter are concentric to one another, the first perimeter and the second perimeter both have an oval shape, a major axis of the first perimeter and a major axis of the second perimeter are both arranged in a same direction as a direction of a long side of a photosensitive area of a chip of the image sensor, and a ratio of a length of the major axis to a length of a minor axis of the first perimeter and a ratio of a length of the major axis to a length of a minor axis of the second perimeter are same as a ratio of the length of the long side to a length of a short side of the photosensitive area.

Each MG may include a third perimeter and a fourth perimeter, and the third perimeter and the fourth perimeter are concentric to one another, a shape of the third perimeter and a shape of the fourth perimeter are same as the shapes of the first perimeter and the second perimeter, a center point of the third perimeter and a center point of the fourth perimeter overlap with a center point of the first perimeter and a center point of the second perimeter, and a pitch angle between the third perimeter and the fourth perimeter is same as a pitch angle between the first perimeter and the second perimeter.

The image sensor may further comprise: a pinning layer on the substrate, a high-K dielectric layer on the pinning layer, a passivation layer on the high-K dielectric layer, and the plurality of DTI structures extend towards the substrate from an upper surface of the high-K dielectric layer or a lower surface of the passivation layer.

According to some example embodiments, a method of forming a pixel may comprise: forming a deep trench isolation (DTI) structure, forming a first photoelectric sensor outside of the DTI structure using first process parameters, and forming a second photoelectric sensor inside of the DTI structure using second process parameters.

The first process parameters may include a first desired concentration of ion implantation of a N buried layer, a first desired implantation energy, a first desired thermal diffusion time, and a first desired temperature, the second process parameters may include a second desired concentration of the ion implantation of the N buried layer, a second desired implantation energy, a second desired thermal diffusion time, and a second desired temperature, and the first desired concentration of the ion implantation of the N buried layer is less than the second desired concentration of the ion implantation of the N buried layer, the first desired implantation energy is less than the second desired implantation energy, the first desired thermal diffusion time is less than the second desired thermal diffusion time, and the first desired temperature is equal to the second desired temperature.

According to some example embodiments, a pixel readout circuit may comprise: a first pass transistor connected to a first photoelectric sensor outside of a deep trench isolation (DTI) structure of a pixel; and a second pass transistor connected to a second photoelectric sensor inside of the DTI structure of the pixel.

According to some example embodiments, a method of calibrating for crosstalk of an image sensor, the image sensor including a plurality of pixels, may comprise: obtaining a first image by reading a plurality of first output signals from the plurality of pixels, the reading the plurality of first output signals including reading a respective first output signal from a first photoelectric sensor of each pixel of the plurality of pixels, the first photoelectric sensor outside of a deep trench isolation (DTI) structure of a respective pixel; obtaining a second image by reading a plurality of second output signals from the plurality of pixels, the reading the plurality of second output signals including reading a respective second output signal from a second photoelectric sensor of each pixel of the plurality of pixels, the second photoelectric sensor inside the DTI structure of the respective pixel; obtaining a third image by combining the first image with the second image; and calibrating the third image using the second image to compensate for the crosstalk.

The calibrating of the third image using the second image may comprise: calculating a first average value of all pixel values of the second image, calculating a plurality of first ratios of each pixel value of the second image to the calculated first average value, calculating a second average value of all pixel values of the third image, and based on the calculated first ratio of a desired pixel value of the second image and the calculated second average value, calibrating a pixel value of a corresponding desired pixel of the third image such that a second ratio of a calibrated pixel value of the corresponding desired pixel of the third image to the calculated second average value is same as the calculated first ratio of the desired pixel value of the second image to the calculated second average value.

According to some example embodiments, a non-transitory computer-readable storage medium stores computer readable instructions that, when executed by at least one processor, cause the at least one processor to execute the method.

The image sensor, the method of forming the pixel, the pixel readout circuit, and/or the calibration method of the image sensor according to some example embodiments may reduce the crosstalk between adjacent CIS pixels.

Other aspects and/or advantages of the example embodiments will be described in the following description, and part will be clear through the description or may be learn through the practice of the example embodiments.

BRIEF DESCRIPTION OF THE DRAWINGS

The above and other objects, features and advantages of the example embodiments will become clearer through the following detailed description together with the accompanying drawings in which.

DETAILED DESCRIPTION

Figure 1:
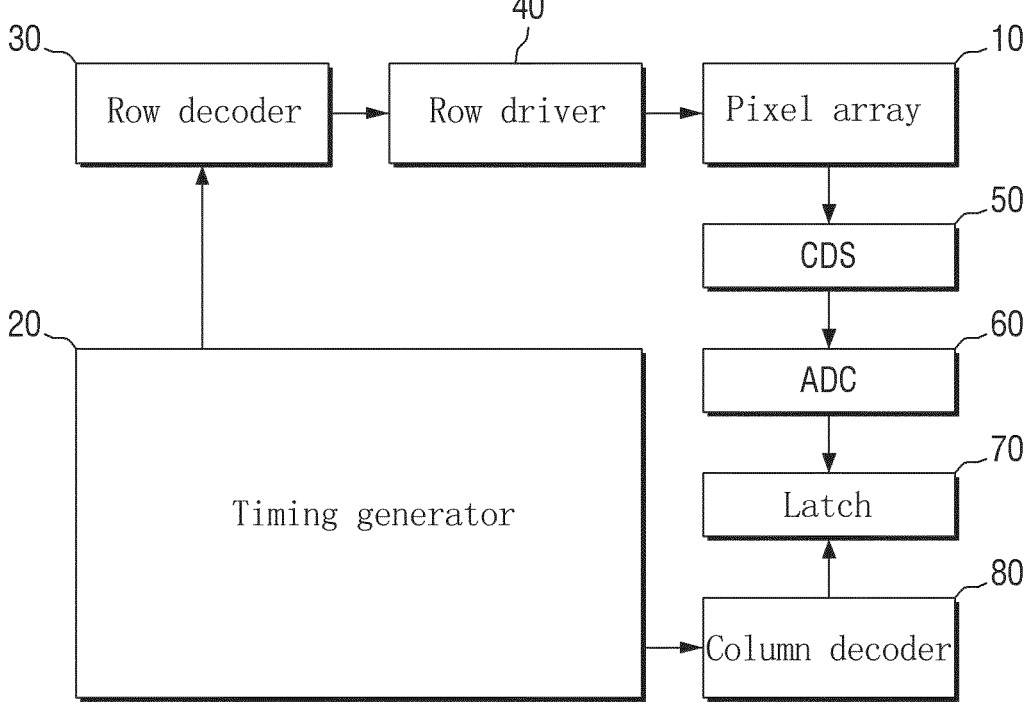
FIG. 1 is a block diagram showing an image sensor according to at least one example embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of the example embodiments of the inventive concepts. For example, the sequences of operations described herein are merely examples, and are not limited to those set forth herein, but may be changed as will be apparent after an understanding of the example embodiments of the inventive concepts, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the example embodiments of the inventive concepts.

The following structural or functional descriptions of example embodiments disclosed are merely intended for the purpose of describing the example embodiments and the example embodiments may be implemented in various forms. The example embodiments are not meant to be limited, but it is intended that various modifications, equivalents, and alternatives are also covered within the scope of the claims.

Although terms of "first" or "second" are used to explain various components, the components are not limited to the terms. These terms should be used only to distinguish one component from another component. For example, a "first" component may be referred to as a "second" component, or similarly, and the "second" component may be referred to as the "first" component within the scope of the right according to the example embodiments of the inventive concepts.

It will be understood that when a component is referred to as being "connected to" another component, the component can be directly connected or coupled to the other component or intervening components may be present.

As used herein, the singular forms "a", "an", and "the" are intended to include the plural forms as well, unless the context clearly indicates otherwise. It should be further understood that the terms "comprises" and/or "comprising," when used in this specification, specify the presence of stated features, integers, steps, operations, elements, components or a combination thereof, but do not preclude the presence or addition of one or more other features, integers, steps, operations, elements, components, and/or groups thereof.

Unless otherwise defined, all terms including technical or scientific terms used herein have the same meaning as commonly understood by one of ordinary skill in the art to which examples belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, example embodiments will be described in detail with reference to the accompanying drawings. Regarding the reference numerals assigned to the elements in the drawings, it should be noted that the same elements will be designated by the same reference numerals, and redundant descriptions thereof will be omitted.

FIG. 1 is a block diagram showing an image sensor according to at least one example embodiment of the inventive concepts.

An image sensor according to various example embodiments of the inventive concepts may be included in, for example, mobile phone, tablet personal computer (PC), personal digital assistant (PDA), etc. However, the example embodiments are not limited thereto, and the image sensor according to at least one example embodiment may be included in any electronic device having an image collection function, e.g., a camera, a video camera, a webcam, etc.

Referring to FIG. 1, an image sensor 100 according to some example embodiments includes a pixel array 10 including a plurality of pixels arranged in two-dimensions, wherein each pixel includes at least two photoelectric sensors for converting a light, e.g., a light signal, photons, etc., into an electric signal, a timing generator 20, a row decoder 30, a row driver 40, a correlated double sampler (CDS) 50, an analog to digital converter (ADC) 60, a latch 70, and/or a column decoder 80, etc., but the example embodiments are not limited thereto. Here, the photoelectric sensor may be a photodiode, and the like, but is not limited thereto.

It will be appreciated by those skilled in the art that the image sensor may include more or fewer components than shown, or the components included in the image sensor may be split or combined.

The pixel array 10 includes a plurality of unit pixels (e.g., pixel units, etc.) which are two-dimensionally arranged. Each of the plurality of unit pixels may perform a function of converting an optical image into a corresponding electrical output signal.

The pixel array 10 may receive a plurality of driving signals including row-select signal, reset signal, charge transfer signal, and so on, from the row driver 40 and may be driven accordingly. Further, the converted electrical output signal may be provided to the correlated double sampler 50 through signal lines (e.g., vertical signal lines, etc.).

The timing generator 20 may generate and/or provide a timing signal and/or a control signal to the row decoder 30 and/or the column decoder 80, etc.

The row driver 40 may generate and/or provide the plurality of driving signals for driving the plurality of unit pixels to the pixel array 10 according to and/or based on a result of decoding at the row decoder 30. The driving signals may be provided to each of the rows when the unit pixels are arranged in array form.

The correlated double sampler 50 may receive an output signal generated by the pixel array 10 through a signal line, e.g., a vertical signal line, etc., and may hold and/or sample the received signal, etc. That is, the correlated double sampler 50 may double-sample a certain and/or desired noise level and/or a signal level according to and/or based on the output signal, and may output a difference level corresponding to a difference between the noise level and the signal level, etc. In other words, the correlated double sampler 50 may determine a difference level between the noise level and the signal level and may then output the determined difference level, etc.

The analog to digital converter 60 may convert an analog signal corresponding to the difference level determined by the correlated double sampler 50 into a digital signal, and output the result of conversion.

The latch 70 may latch the digital signal, and may output the latched signal to at least one image signal processor sequentially according to and/or based on the result of decoding at the column decoder 80.

The cross-sectional view of the image sensor according to at least one example embodiment of the inventive concepts is described below in connection with FIG. 2.

Figure 2:
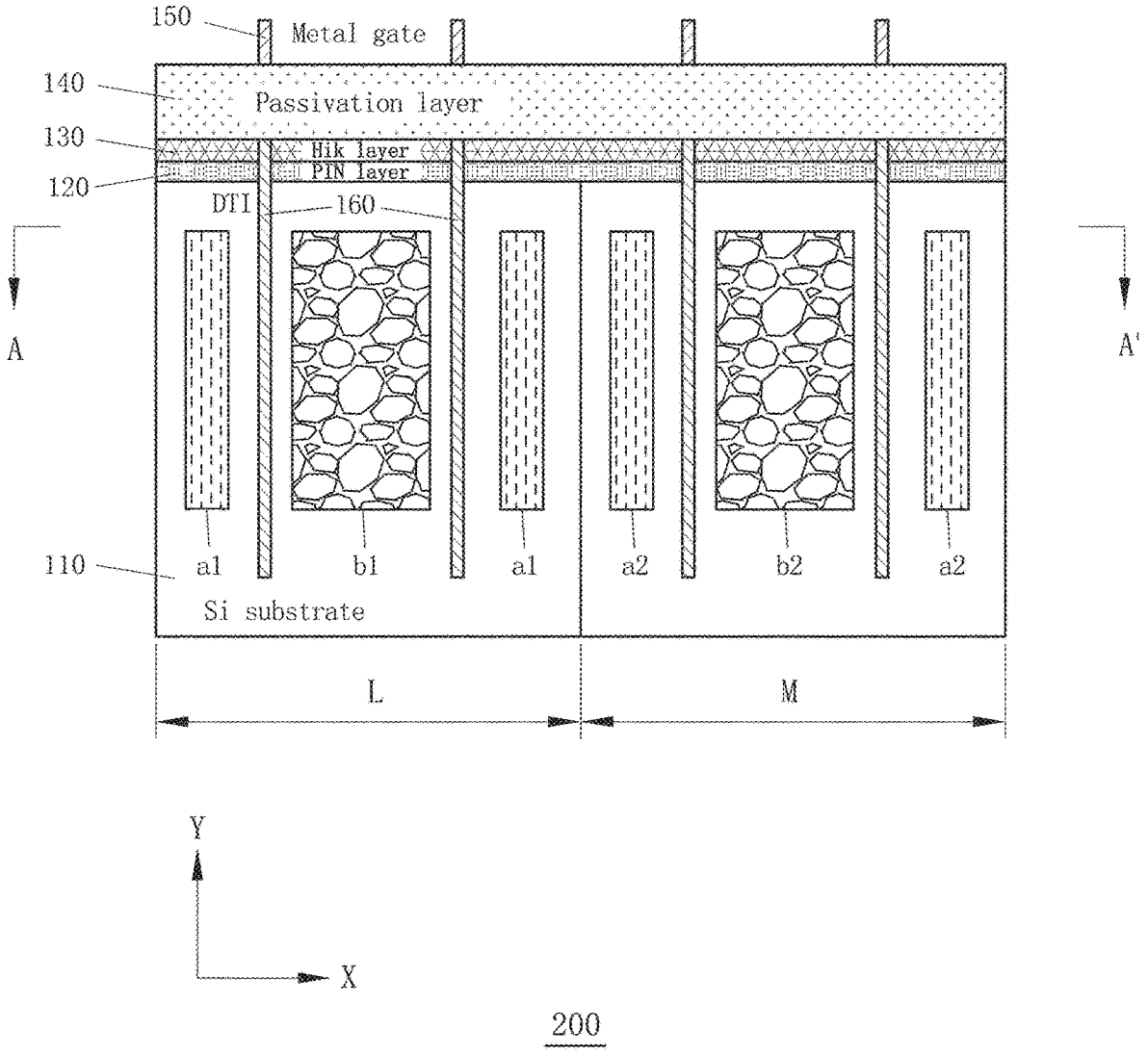
FIG. 2 is a cross-sectional view showing the image sensor according to at least one example embodiment.
Figure 3:
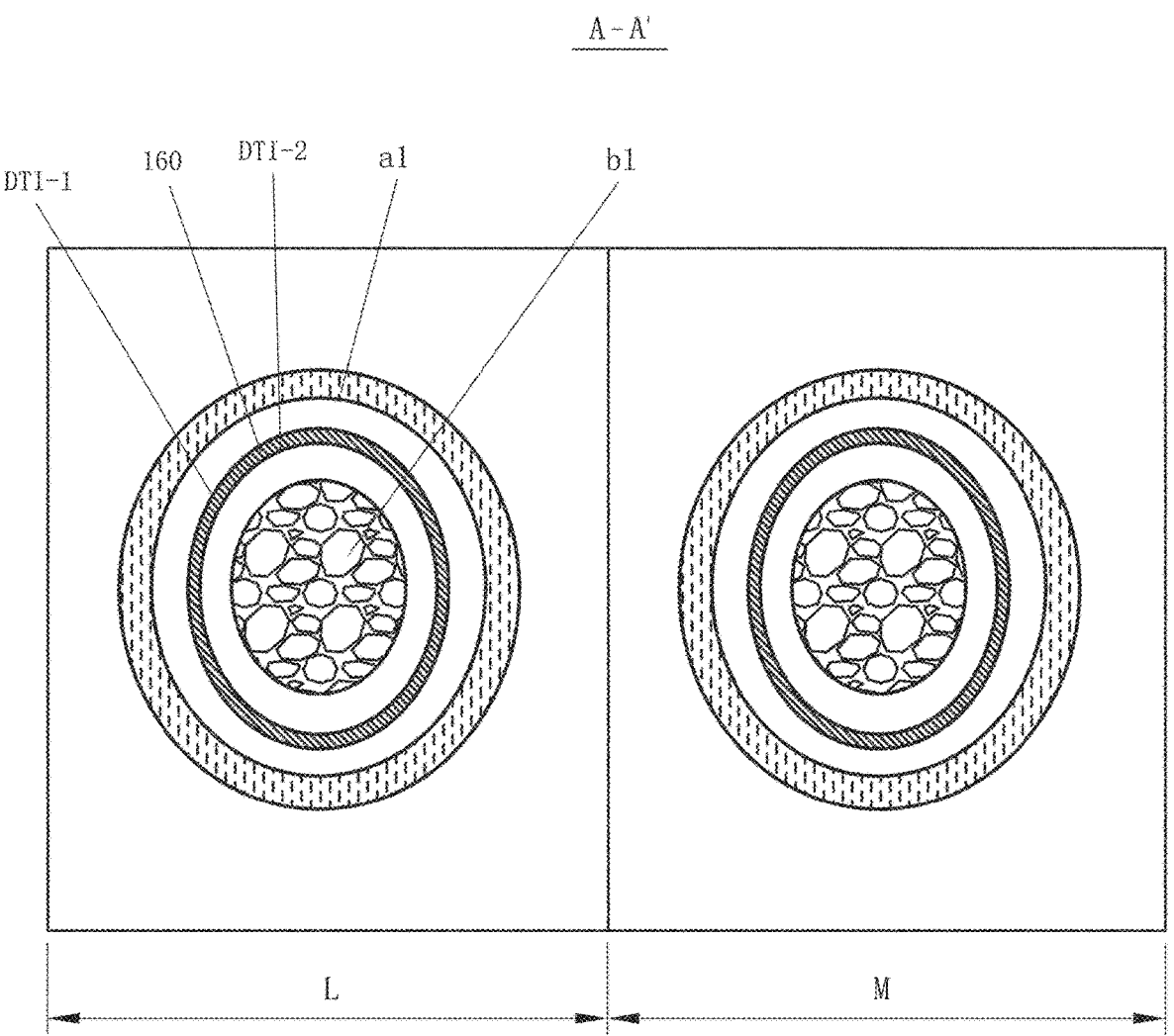
FIG. 3 is a top view of the image sensor along a line A-A' according to at least one example embodiment.

FIG. 2 is a cross-sectional view showing the image sensor according to at least one example embodiment of the inventive concepts. FIG. 3 is a top view of the image sensor along a line A-A' according to at least one example embodiment of the inventive concepts.

Referring to FIG. 2, an image sensor 200 includes a substrate layer 110, e.g., a silicon (Si) substrate layer, etc., a pinning (PIN) layer 120, a high insulation medium (Hik) layer 130, a passivation layer 140, a plurality of metal gates (MGs) 150, and/or deep trench isolation (DTI) structures 160, etc., but the example embodiments are not limited thereto, and for example, the image sensor 200 may include a greater or lesser number of constituent components.

The Si substrate layer 110 may include a plurality of pixels, each of which includes at least a first photoelectric sensor and a second photoelectric sensor for converting sensed, received, and/or observed light, photos, and/or light signals into electric signals.

As shown in FIG. 2, according to at least one example embodiment, the Si substrate layer 110 may include at least a first pixel L and a second pixel M, wherein the first pixel L may include at least a first photoelectric sensor a1 and a second photoelectric sensor b1, and the second pixel M may include at least a first photoelectric sensor a2 and a second photoelectric sensor b2, wherein the second photoelectric sensor b1 is included, arranged, and/or accommodated in the first photoelectric sensor a1 and the second photoelectric sensor b2 is included, arranged, and/or accommodated in the first photoelectric sensor a2. However, the example embodiments are not limited thereto, and the number of the pixels included in the Si substrate layer and the number of the photoelectric sensors included in each pixel may be variously changed as desired and/or needed.

The PIN layer 120 may be disposed and/or arranged on the Si substrate layer 110, but is not limited thereto.

The Hik layer 130 may be disposed and/or arranged on the PIN layer 120, but is not limited thereto. The Hik layer 130 may also be referred to as a high-K dielectric layer.

The passivation layer 140 may be disposed and/or arranged on the Hik layer 130, but is not limited thereto.

In some example embodiments, each DTI structure 160 may be disposed and/or arranged in a corresponding pixel or pixel region to isolate the first photoelectric sensor and the second photoelectric sensor of the corresponding pixel or pixel region. For example, one DTI structure 160 may be disposed and/or arranged within the first pixel L to isolate the first photoelectric sensor a1 from the second photoelectric sensor b1 of the first pixel L. In the first pixel L, the second photoelectric sensor b1 is disposed and/or arranged at a center of the first pixel L, the second photoelectric sensor b1 is accommodated and/or arranged in the DTI structure, and the DTI structure is accommodated and/or arranged in the first photoelectric sensor a1, but the example embodiments are not limited thereto. Additionally, according to at least one example embodiment, center lines of the first photoelectric sensor a1, the DTI structure and the second photoelectric sensor b1 in the first pixel L may coincide, or in other words, the center of the first photoelectric sensor a1, the DTI structure and the second photoelectric sensor b1 in the first pixel L may be parallel to and/or overlap each other in at least one direction, e.g., the Y-direction, but the example embodiments are not limited thereto.

In some example embodiments, the DTI structures 160 may extend from a surface where the Hik layer 130 and the passivation layer 140 contact each other and extend towards the Si substrate layer 110, but the example embodiments are not limited thereto. For example, the DTI structures 160 may extend from an upper surface of the Hik layer 130 or a lower surface of the passivation layer 140 towards the Si substrate layer 110, but are not limited thereto.

Each MG 150 may be disposed and/or arranged on each DTI structure correspondingly, but are not limited thereto.

In some example embodiments, each DTI structure includes a first perimeter (e.g., see DTI-1 of FIG. 3) and a second perimeter (e.g., see DTI-2 of FIG. 3) that are concentric to one another and have a same and/or substantially similar shape (e.g., within +/−10% of each other), each MG includes a third perimeter and a fourth perimeter that are concentric to one another and have a same and/or substantially similar shape, shapes of the third perimeter and the fourth perimeter are the same and/or substantially similar as the shapes of the first perimeter and the second perimeter, and centers of the third perimeter and the fourth perimeter of the MG coincide with centers of the first perimeter and the second perimeter of the DTI structure corresponding to the MG, but the example embodiments are not limited thereto. For example, the shapes of the first perimeter, the second perimeter, the third perimeter and the fourth perimeter may be shapes with corners (e.g., triangles, rectangles, squares, etc.) or shapes without corners (e.g., circles, ovals, etc.).

However, in the case that the shapes of the first perimeter and the second perimeter, and the third perimeter and the fourth perimeter are the shapes with the corners, there may be corner stresses and/or process defects, which may cause the occurrence of dark current, e.g., electric current and/or electric signal produced by pixels of the image sensor when those pixels do not receive light and/or photons. In addition, in the case that the shapes of the first perimeter, the second perimeter, the third perimeter and the fourth perimeter are shapes (e.g., circles) without directions and/or the directions of the shapes of the first perimeter, the second perimeter, the third perimeter and the fourth perimeter are not consistent with (e.g., arranged in a different direction as) a direction of a photosensitive area of a chip of the image sensor 200, a quantum efficiency of photoelectric conversion may not be high.

Thus, in order to further overcome the above issues, the shapes of the first perimeter and the second perimeter of the DTI structure, according to at least one example embodiment may be set as ovals, or in other words, shapes wherein the major axes of the first perimeter and the second perimeter are consistent with (and/or arranged in the same direction as) a long side of the photosensitive area of the chip of the image sensor 200 in direction, and ratios of the lengths of the major axes to the lengths of the minor axes of the first perimeter and the second perimeter are the same as and/or substantially the same as a ratio of a length of the long side to a length of a short side of the photosensitive area, but the example embodiments are not limited thereto. FIG. 3 shows the top view of the image sensor along the line A-A' in the case that the shapes of the first perimeter and the second perimeter of the DTI structure are set as the ovals, but the example embodiments are not limited thereto.

In some example embodiments, a pitch (e.g., angle, a pitch angle, etc.) between the third perimeter and the fourth perimeter of each MG is the same as, or different from, a pitch between the first perimeter and the second perimeter of each DTI structure, etc.

In at least one example embodiment, the two photoelectric sensors may be isolated by disposing and/or arranging the DTI structure and the MG in the pixel, such that an image not affected by crosstalk and/or image noise, and an image affected by the crosstalk and/or image noise are obtained by the two photoelectric sensors, and the crosstalk and/or image noise is calibrated for, compensated for, and/or reduced by using the two images. Hereinafter, a method of calibrating the crosstalk and/or image noise is described with reference to FIG. 6.

In at least one example embodiment, by setting the shapes of the DTI structure and the MG as ovals, and setting the direction of the ovals to be consistent with (and/or arranged in the same direction as) the direction of the long side of the photosensitive area of the chip of the image sensor 200, crosstalk in a diagonal direction may be further reduced, an issue of dark current in the pixel may be reduced, decreased, and/or optimized, and/or an amount of light entering the pixel may be increased, such that the quantum efficiency of photoelectric conversion is increased significantly, but the example embodiments are not limited thereto.

Figure 4:
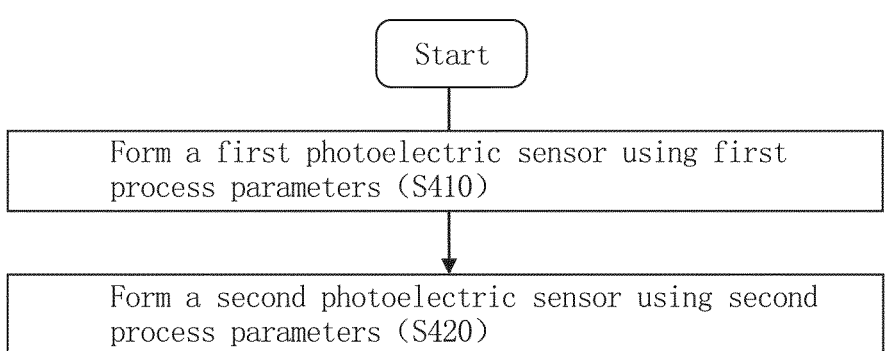
FIG. 4 is a flowchart showing a method of forming a pixel according to at least one example embodiment.

FIG. 4 is a flowchart showing a method of forming a pixel according to at least one example embodiment of the inventive concepts.

In some example embodiments, a method of forming the above pixel includes dividing a depletion zone inside the pixel into an annular depletion zone Depletion1 outside the DTI structure and an oval depletion zone Depletion2 inside the DTI structure. The depletion zones inside the pixel may be divided by adjusting a concentration of ion implantation of N buried layer, a implantation energy, a thermal diffusion time, and/or a temperature, wherein the annular depletion zone Depletion1 outside the DTI structure and the oval depletion zone Depletion2 inside the DTI structure are isolated by the DTI structure. Here, the annular depletion zone Depletion1 outside the DTI structure may constitute the first photoelectric sensor of the pixel, and the oval depletion zone Depletion2 inside the DTI structure may constitute the second photoelectric sensor of the pixel, but the example embodiments are not limited thereto.

Particularly, referring to FIG. 4, according to at least one example embodiment, in operation S410, the first photoelectric sensor disposed outside the DTI structure of the pixel is formed using first process parameters (e.g., desired first process parameters, etc.).

In operation S 420, the second photoelectric sensor disposed inside the DTI structure of the pixel is formed using second process parameters (e.g., desired second process parameters and/or process parameters different from the desired first process parameters, etc.), but is not limited thereto.

In some example embodiments, the first process parameters may include a first concentration of ion implantation of N buried layer, a first implantation energy, a first thermal diffusion time, and/or a first temperature; and the second process parameters may include a second concentration of the ion implantation of N buried layer, a second implantation energy, a second thermal diffusion time, and/or a second temperature. For example, the first concentration of the ion implantation of N buried layer may be less than the second concentration of the ion implantation of N buried layer, the first implantation energy may be less than the second implantation energy, the first thermal diffusion time may be less than the second thermal diffusion time, and/or the first temperature may be equal to the second temperature, but the example embodiments are not limited thereto.

For example, the first concentration of the ion implantation of N buried layer may be $4\times10^{19}$/cm$^3$, the first implantation energy may be 15 key, the first thermal diffusion time may be one minute, and the first temperature may be 1000° C., but the example embodiments are not limited thereto; and the second concentration of the ion implantation of N buried layer may be $5\times10^{19}$/cm$^3$, the second implantation energy may be 20 key, the second thermal diffusion time may be five minutes, and the second temperature may be 1000° C., but the example embodiments are not limited thereto, and the first process parameters and/or the second process parameters may include other parameters, and the individual values of one or more of the first process parameters and/or the individual values of one or more of the second process parameters may be changed as needed.

Although FIG. 4 shows that the first photoelectric sensor is formed before the second photoelectric sensor is formed, the example embodiments are not limited thereto, and for example, the first photoelectric sensor may be formed after the second photoelectric sensor is formed. In addition, the method of forming the above pixel is not limited to the method shown in FIG. 4, and other methods may also be used to form the above pixel(s) of the photoelectric sensors.

Figure 5:
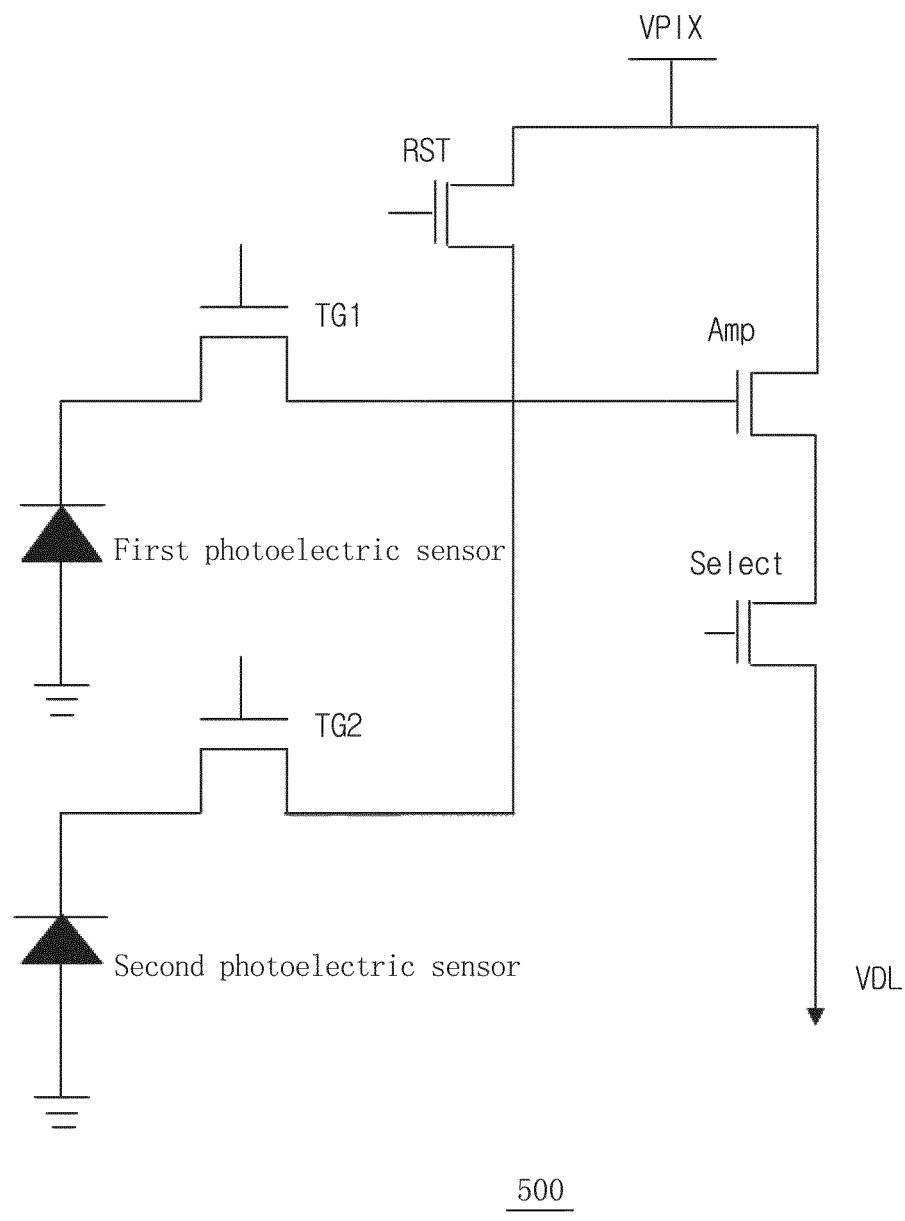
FIG. 5 is a circuit diagram showing a pixel readout circuit according to at least one example embodiment.

FIG. 5 is a circuit diagram showing a pixel readout circuit according to at least one example embodiment of the inventive concepts.

In some example embodiments, a pixel readout circuit 500 may be included in the image sensor, but the example embodiments are not limited thereto, and for example, the pixel readout circuit 500 may be external to the image sensor, etc.

As shown in FIG. 5, the pixel readout circuit 500 may include a first pass transistor TG1, a second pass transistor TG2, a reset transistor RST, a source follower amplifier Amp, a selection transistor Select, and/or a vertical signal line VDL, etc., but the example embodiments are not limited thereto.

The first pass transistor TG1 (for example, a drain terminal of the first pass transistor TG1) may be connected to the first photoelectric sensor disposed outside of (and/or external to) the DTI structure of the pixel, but is not limited thereto.

A gate of the source follower amplifier Amp may be connected to a source terminal of the first pass transistor TG1, and a source terminal of the source follower amplifier Amp may be connected to a drain terminal of the selection transistor Select, but the example embodiments are not limited thereto.

In some example embodiments, a signal of the first photoelectric sensor may be read by the first pass transistor TG1, the source follower amplifier Amp, and/or the selection transistor Select, but are not limited thereto.

The second pass transistor TG2 (for example, a drain terminal of the second pass transistor TG2) may be connected to the second photoelectric sensor disposed inside of (and/or internal to) the DTI structure of the pixel, but is not limited thereto.

A drain terminal of the reset transistor RST may be connected to a source terminal of the second pass transistor TG2, and a source terminal of the reset transistor RST may be connected to a drain terminal of the source follower amplifier Amp and may be applied with a power supply voltage VPIX, but the example embodiments are not limited thereto.

In some example embodiments, a signal of the second photoelectric sensor may be read by the second pass transistor TG2, the reset transistor RST, the source follower amplifier, and/or the selection transistor Select, etc., but is not limited thereto.

Although FIG. 5 shows the example of the pixel readout circuit, it will be appreciated by people of ordinary skill in the art that other pixel readout circuits that can read out the signals of two photoelectric sensors and/or two depletion zones in one pixel respectively may also be used, and/or pixels with more than two photoelectric sensors and/or more than two depletion zones may also be used, etc.

Figure 6:
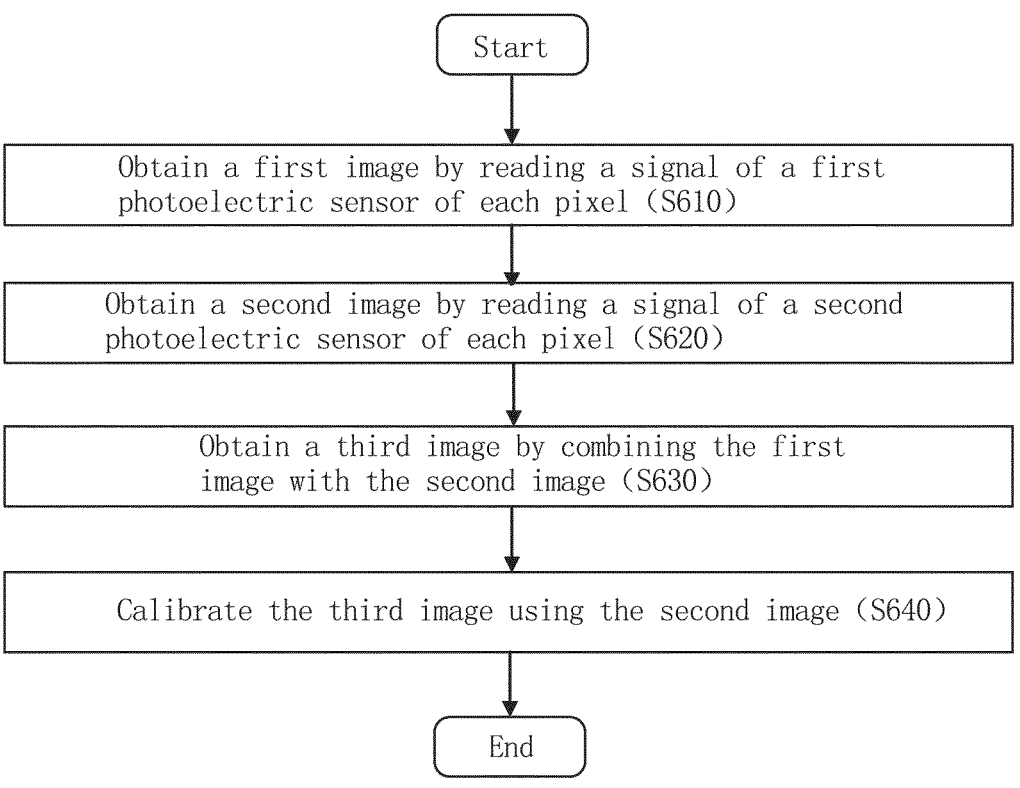
FIG. 6 is flowchart showing a method of calibrating crosstalk according to at least one example embodiment.

FIG. 6 is flowchart showing a method of calibrating crosstalk according to at least one example embodiment of the inventive concepts.

In some example embodiments, a following method of calibrating the crosstalk may be performed by at least one processor disposed outside (e.g., external to) the at least one image sensor, but the example embodiments are not limited thereto.

Referring to FIG. 6, in operation S610, the processor may obtain and/or generate a first image by reading, receiving, and/or obtaining a signal from and/or output by a first photoelectric sensor outside of a DTI structure of each pixel.

In operation S620, the processor may obtain and/or generate a second image by reading, receiving, and/or obtaining a signal from and/or output by a second photoelectric sensor inside the DTI structure of each pixel.

For example, the first image represents an image affected by the crosstalk, e.g., the crosstalk generated between adjacent pixels, and the second image represents an image not affected by and/or affected less by the crosstalk.

In operation S630, the processor may obtain and/or generate a third image by combining the first image with the second image.

For example, the processor may obtain and/or generate the third image by adding pixels values of corresponding pixels of the first image and the second image.

In operation S640, the processor may calibrate the third image using the second image, or in other words, the processor may perform a calibration operation based on the third image and the second image. The calibrated third image may a high-quality image, e.g., a higher quality image than the first image, that is less affected by the crosstalk than the first image.

In some example embodiments, the processor may calibrate the third image by first calculating a first average value of pixel values of a plurality of pixels of the second image, or in other words, calculating a first average pixel value of the plurality of pixels included in the second image. Second, the processor may calculate a ratio of a pixel value of each pixel of the second image to the first average value, or in other words, compare the value of each pixel of the second image to the calculated first average pixel value. Third, the processor may calculate a second average value of pixel values of a plurality of pixels of the third image, or in other words, calculate a second average pixel value of the plurality of pixels included in the third image. Fourth, the processor may, based on the ratio of the pixel value of each pixel of the second image to the first average value and the second average value, calibrate and/or adjust a pixel value of a corresponding pixel of the third image such that the ratio of the pixel value of each pixel of the second image to the first average value is the same as a ratio of the calibrated pixel value of the corresponding pixel of the third image to the second average value.

In another example embodiment, the processor may also divide the second image into a plurality of regions before calibrating the third image, and may perform the above calibration method by units of the regions, or in other words, may calibrate the third image on a region-by-region basis.

Although a method of calibrating the crosstalk using the image affected by the crosstalk and the image not affected by the crosstalk according to at least one example embodiment of the inventive concepts is shown above, it will be appreciated to those skilled in the art that other methods of calibrating the crosstalk using the image affected by the crosstalk and the image not affected by the crosstalk in the art may also be used.

Figure 7:
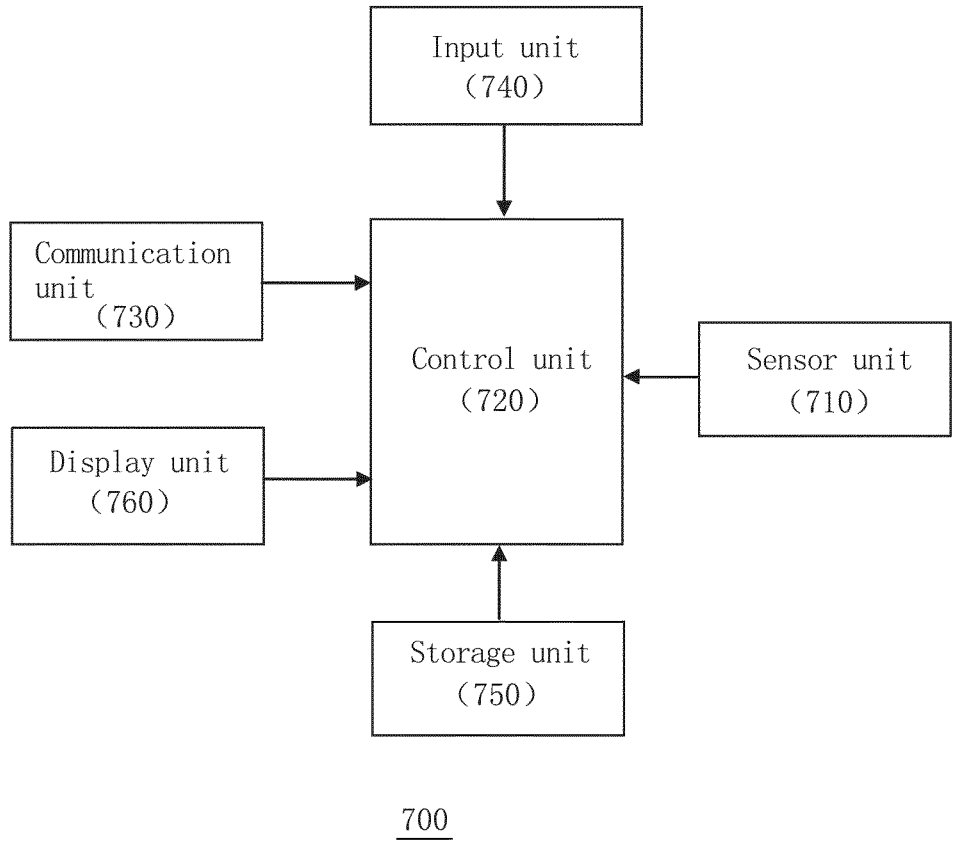
FIG. 7 is a block diagram showing a mobile terminal according to at least one example embodiment.

FIG. 7 is a block diagram showing a mobile terminal according to at least one example embodiment of the inventive concepts.

As shown in FIG. 7, the mobile terminal 700 in some example embodiments includes at least one sensor unit 710, a control unit 720 (e.g., processing circuitry, a controller, a processor, etc.), a communication unit 730, an input unit 740 (e.g., an input device, etc.), a storage unit 750 (e.g., memory, etc.), and/or a display unit 760 (e.g., a display device, etc.), etc., but the example embodiments are not limited thereto.

The sensor unit (e.g., the image sensor according to at least one example embodiment, etc.) 710 is connected to the control unit 720. The sensor unit 710 is used to capture images (e.g., the first image and second image of FIG. 6, etc.). The control unit 720 processes the images output by the sensor unit 710 (for example, using the method shown in FIG. 6). The control unit 720 may display the processed images (e.g., the calibrated third image) on the display unit 760 and/or store them in the storage unit 750, etc., but is not limited thereto.

The communication unit 730 may perform a communication operation of the mobile terminal. The communication unit 730 may establish a communication channel to the communication network and/or may perform communication associated with, for example, image processing.

The input unit 740 is configured to receive various input information (e.g., user inputs, etc.) and/or various control signals, and/or transmit the input information and/or control signals to the control unit 720. The input unit 740 may be realized by various input devices such as touch screens, keyboards, mice, microphones, cameras, etc.; however, the example embodiments are not limited thereto.

The storage unit 750 may include at least one volatile memory and/or nonvolatile memory. The storage unit 750 may store various data generated and used by the mobile terminal. For example, the storage unit 750 may store an operating system (OS) and one or more applications, such as special purpose software applications associated with one or more of the methods of the example embodiments of the inventive concepts, etc., for controlling the operation of the mobile terminal. The control unit 720 may control the overall operation of the mobile terminal and/or may control part or all of the internal elements of the mobile terminal. The control unit 720 may be implemented as general-purpose processor, application processor (AP), application specific integrated circuit, field programmable gate array, etc., but the example embodiments are not limited thereto.

The apparatuses, units, modules, devices, and/or other components described herein are implemented by hardware components, and/or are implemented by hardware components executing software, etc. Examples of hardware components that may be used to perform the operations described in this application where appropriate include controllers, sensors, generators, drivers, memories, comparators, arithmetic logic units, adders, subtractors, multipliers, dividers, integrators, and/or any other electronic components configured to perform the operations of one or more of the example embodiments described in this application. In other example embodiments, one or more of the hardware components that perform the operations described in this application are implemented by computing hardware, for example, by one or more processors and/or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, and/or any other device or combination of devices that is configured to respond to and execute computer readable and/or computer executable instructions (e.g., software, firmware, application, program code, etc.) in a defined manner to achieve a desired result. In one example, a processor or computer includes, or is connected to, one or more memories storing instructions or software (e.g., computer readable instructions, computer executable instructions, machine readable instructions, machine executable instructions, etc.) that are executed by the processor and/or computer. Hardware components implemented by a processor and/or computer may execute special purpose instructions and/or software, such as an operating system (OS) and one or more software applications that run on the OS, to perform the operations of one or more of the example embodiments described in this application. The hardware components may also access, manipulate, process, create, and/or store data in response to execution of the special purpose instructions and/or software, which thereby transforms the hardware components (e.g., the processor and/or computer) into special purpose hardware components (e.g., special purpose processors and/or special purpose computers, etc.). For simplicity, the singular term "processor" and/or "computer" may be used in the description of the example embodiments described in this application, but in other example embodiments multiple processors and/or computers may be used, or a processor and/or computer may include multiple processing elements, or multiple types of processing elements, or both. For example, a single hardware component or two or more hardware components may be implemented by a single processor, or two or more processors, and/or a processor and a controller, etc. One or more hardware components may be implemented by one or more processors, and/or a processor and a controller, and one or more other hardware components may be implemented by one or more other processors, and/or another processor and another controller. One or more processors, and/or a processor and a controller, etc., may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and/or multiple-instruction multiple-data (MIMD) multiprocessing, etc.

The methods that perform the operations described in this application are performed by computing hardware, for example, by one or more processors and/or computers, implemented as described above executing special purpose instructions and/or special purpose software to perform the operations of the one or more example embodiments described in this application that are performed by the methods. For example, a single operation or two or more operations may be performed by a single processor, or two or more processors, and/or a processor and a controller, etc. One or more operations may be performed by one or more processors, or a processor and a controller, and one or more other operations may be performed by one or more other processors, or another processor and another controller, etc. One or more processors, or a processor and a controller, may perform a single operation, or two or more operations, etc.

Special purpose instructions and/or software to control a processor and/or computer to implement the hardware components and perform the methods of one or more of the example embodiments as described above are written as computer programs, code segments, instructions or any combination thereof, for individually or collectively instructing or configuring the processor or computer to operate as a special purpose machine and/or special-purpose computer to perform the operations performed by the hardware components and the one or more methods of the example embodiments as described above. In at least one example embodiment, the instructions and/or software include machine code that is directly executed by the processor or computer, such as machine code produced by a compiler. In another example embodiment, the instructions or software include higher-level code that is executed by the processor and/or computer using an interpreter. Programmers of ordinary skill in the art may readily write the instructions and/or software based on the block diagrams and the flow charts illustrated in the drawings and the corresponding descriptions in the specification, which disclose algorithms for performing the operations performed by the hardware components and the methods of one or more example embodiments as described above.

The instructions or software to control a processor or computer to implement the hardware components and perform the methods as described above, and any associated data, data files, and data structures, are recorded, stored, or fixed in or on one or more non-transitory computer-readable storage media. Examples of a non-transitory computer-readable storage medium include read-only memory (ROM), random-access programmable read only memory (PROM), electrically erasable programmable read-only memory (EEPROM), random-access memory (RAM), dynamic random access memory (DRAM), static random access memory (SRAM), flash memory, non-volatile memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, blue-ray or optical disk storage, hard disk drive (HDD), solid state drive (SSD), flash memory, a card type memory such as multimedia card or a micro card (for example, secure digital (SD) or extreme digital (XD)), magnetic tapes, floppy disks, magneto-optical data storage devices, optical data storage devices, hard disks, solid-state disks, and/or any other device that is configured to store the instructions or software and any associated data, data files, and data structures in a non-transitory manner and providing the instructions or software and any associated data, data files, and data structures to a processor and/or computer so that the processor and/or computer can execute the instructions.

While this disclosure includes descriptions of specific examples embodiments, it will be apparent to one of ordinary skill in the art that various changes in form and details may be made in these example embodiments without departing from the spirit and scope of the claims and their equivalents.

What is claimed is:

1. An image sensor, comprising:
a substrate including a plurality of pixels, each pixel of the plurality of pixels configured to convert light into a corresponding electric signal, each pixel including,
a first photoelectric sensor and a second photoelectric sensor, the second photoelectric sensor included inside the first photoelectric sensor;
a plurality of deep trench isolation (DTI) structures, each DTI structure of the plurality of DTI structures configured to isolate the first photoelectric sensor and the second photoelectric sensor of a corresponding pixel of the plurality of pixels, each DTI structure in the corresponding pixel in the substrate;
a plurality of metal gates (MGs) on the plurality of DTI structures, wherein the first photoelectric sensor is configured to generate a signal corresponding to a first image, and
the second photoelectric sensor is configured to generate a signal corresponding to a second image that has less crosstalk than the first image; and
at least one processor configured to,
obtain a third image by combining the first image with the second image, and
calibrate the third image using the second image to compensate for the crosstalk in the first image.

2. The image sensor of claim 1, wherein
in each of the pixels of the plurality of pixels, the second photoelectric sensor is at a center of the pixel, the second photoelectric sensor is included inside the DTI structure, and the DTI structure is included inside the first photoelectric sensor; and
in each of the pixels, a center line corresponding to the first photoelectric sensor, a center line of the DTI structure, and a center line of the second photoelectric sensor overlap in at least one direction.

3. The image sensor of claim 1, wherein
each DTI structure of the plurality of DTI structures includes a first perimeter and a second perimeter, and the first perimeter and the second perimeter are concentric to one another;
the first perimeter and the second perimeter both have an oval shape;
a major axis of the first perimeter and a major axis of the second perimeter are both arranged in a same direction as a direction of a long side of a photosensitive area of a chip of the image sensor; and
a ratio of a length of the major axis to a length of a minor axis of the first perimeter and a ratio of a length of the major axis to a length of a minor axis of the second perimeter are same as a ratio of the length of the long side to a length of a short side of the photosensitive area.

4. The image sensor of claim 3, wherein
each MG of the plurality of MGs includes a third perimeter and a fourth perimeter, and the third perimeter and the fourth perimeter are concentric to one another;
a shape of each of the third perimeters and a shape of each of the fourth perimeters are same as the shapes of each of the first perimeters and each of the second perimeters; and
a center point of the third perimeter and a center point of the fourth perimeter overlap with a center point of the first perimeter and a center point of the second perimeter.

5. The image sensor of claim 1, further comprising:
a pinning layer on the substrate;
a high-K dielectric layer on the pinning layer;
a passivation layer on the high-K dielectric layer; and
the plurality of DTI structures extend towards the substrate from an upper surface of the high-K dielectric layer or a lower surface of the passivation layer.

6. The image sensor of claim 1, wherein the at least one processor is further configured to:
obtain the first image by reading a plurality of first output signals from the plurality of pixels, the reading the plurality of first output signals including reading a respective first output signal from the first photoelectric sensor of each pixel of the plurality of pixels; and
obtain the second image by reading a plurality of second output signals from the plurality of pixels, the reading the plurality of second output signals including reading a respective second output signal from the second photoelectric sensor of each pixel of the plurality of pixels.

7. The image sensor of claim 6, wherein the at least one processor is further configured to calibrate the third image using the second image by:

calculating a first average value of all pixel values of the second image.

8. The image sensor of claim 7, wherein the at least one processor is further configured to calibrate the third image using the second image by:

calculating a plurality of first ratios of each pixel value of the second image to the calculated first average value; and calculating a second average value of all pixel values of the third image.

9. The image sensor of claim 8, wherein the at least one processor is further configured to calibrate the third image using the second image by:

based on the calculated first ratio of a desired pixel value of the second image and the calculated second average value, calibrating a pixel value of a corresponding desired pixel of the third image such that a second ratio of a calibrated pixel value of the corresponding desired pixel of the third image to the calculated second average value is same as the calculated first ratio of the desired pixel value of the second image to the calculated second average value.

10. The image sensor of claim 6, wherein the at least one processor is further configured to calibrate the third image using the second image by:

dividing the second image into a plurality of regions before calibrating the third image.

11. The image sensor of claim 10, wherein the at least one processor is further configured to calibrate the third image using the second image by:

calibrating the third image on a region-by-region basis of the second image.

12. The image sensor of claim 11, wherein the at least one processor is further configured to calibrate the third image using the second image by:

calculating a first average value of all regions of the second image;

calculating a plurality of first ratios of each of the regions of the second image to the calculated first average value; and calculating a second average value of all regions of the third image.

13. An image sensing device, comprising:

a first pass transistor connected to a first photoelectric sensor outside of a deep trench isolation (DTI) structure of a pixel, the DTI structure having an oval shape;

a second pass transistor connected to a second photoelectric sensor inside of the DTI structure of the pixel, the DTI structure configured to isolate the second photoelectric sensor; and at least one processor configured to, obtain a first image by reading a first output signal from the first photoelectric sensor using the first pass transistor, obtain a second image that has less crosstalk than the first image by reading a second output signal from the second photoelectric sensor using the second pass transistor, obtain a third image by combining the first image with the second image, and calibrate the third image using the second image to compensate for the crosstalk in the first image.

14. The image sensing device of claim 13, wherein the second photoelectric sensor is at a center of the pixel, the second photoelectric sensor included inside the DTI structure, and the DTI structure is included inside the first photoelectric sensor; and a center line corresponding to the first photoelectric sensor, a center line of the DTI structure, and a center line of the second photoelectric sensor overlap in at least one direction.

15. The image sensing device of claim 13, wherein the DTI structure includes a first perimeter and a second perimeter, and the first perimeter and the second perimeter are concentric to one another;

the first perimeter and the second perimeter both have an oval shape;

a major axis of the first perimeter and a major axis of the second perimeter are both arranged in a same direction as a direction of a long side of a photosensitive area of a chip of an image sensor included in the image sensing device; and a ratio of a length of the major axis to a length of a minor axis of the first perimeter and a ratio of a length of the major axis to a length of a minor axis of the second perimeter are same as a ratio of the length of the long side to a length of a short side of the photosensitive area.

16. The image sensing device of claim 15, further comprising:

a metal gate (MG) on the DTI structure, the MG including a third perimeter and a fourth perimeter, the third perimeter and the fourth perimeter being concentric to one another;

a shape of the third perimeter and a shape of the fourth perimeter are same as the shapes of the first perimeter and the second perimeter; and a center point of the third perimeter and a center point of the fourth perimeter overlap with a center point of the first perimeter and a center point of the second perimeter.

17. The image sensing device of claim 13, further comprising:

a pinning layer on a substrate;

a high-K dielectric layer on the pinning layer;

a passivation layer on the high-K dielectric layer; and the DTI structure extending towards the substrate from an upper surface of the high-K dielectric layer or a lower surface of the passivation layer.

18. The image sensing device of claim 13, wherein the at least one processor is further configured to calibrate the third image using the second image by:

calculating a first average value of all pixel values of the second image;

calculating a plurality of first ratios of each pixel value of the second image to the calculated first average value;

calculating a second average value of all pixel values of the third image; and based on the calculated first ratio of a desired pixel value of the second image and the calculated second average value, calibrating a pixel value of a corresponding desired pixel of the third image such that a second ratio of a calibrated pixel value of the corresponding desired pixel of the third image to the calculated second average value is same as the calculated first ratio of the desired pixel value of the second image to the calculated second average value.

19. The image sensing device of claim 13, wherein the at least one processor is further configured to calibrate the third image using the second image by:

dividing the second image into a plurality of regions before calibrating the third image; and calibrating the third image on a region-by-region basis of the second image.

20. The image sensing device of claim 13, wherein the at least one processor is further configured to calibrate the third image using the second image by:

calculating a first average value of all regions of the second image;

calculating a plurality of first ratios of each of the regions of the second image to the calculated first average value; and calculating a second average value of all regions of the third image.

\* \* \* \* \*